United States Patent
Akaogi

(10) Patent No.: US 7,227,768 B2
(45) Date of Patent: Jun. 5, 2007

(54) POWER INTERCONNECT STRUCTURE FOR BALANCED BITLINE CAPACITANCE IN A MEMORY ARRAY

(75) Inventor: Takao Akaogi, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 34 days.

(21) Appl. No.: 11/173,930

(22) Filed: Jul. 1, 2005

(65) Prior Publication Data
US 2007/0002602 A1    Jan. 4, 2007

(51) Int. Cl.
    *G11C 5/06*    (2006.01)
(52) U.S. Cl. .......................................... 365/63; 365/214
(58) Field of Classification Search .................. 365/63, 365/214
    See application file for complete search history.

(56) References Cited

U.S. PATENT DOCUMENTS

| | | | | |
|---|---|---|---|---|
| 4,242,736 A | * | 12/1980 | Raffel et al. ................. | 365/191 |
| 4,833,518 A | * | 5/1989 | Matsuda et al. ............. | 257/301 |
| 4,905,068 A | * | 2/1990 | Satoh et al. ................. | 257/296 |
| 4,922,460 A | * | 5/1990 | Furutani et al. ............. | 365/207 |
| 5,214,601 A | * | 5/1993 | Hidaka et al. ................ | 365/63 |
| 5,325,336 A | * | 6/1994 | Tomishima et al. .......... | 365/207 |
| 5,426,615 A | * | 6/1995 | Tomishima et al. .......... | 365/226 |
| 5,485,419 A | * | 1/1996 | Campbell ..................... | 365/69 |
| 5,495,440 A | * | 2/1996 | Asakura ....................... | 365/149 |
| 5,581,126 A | * | 12/1996 | Moench ........................ | 257/776 |
| 5,602,793 A | * | 2/1997 | Tomishima et al. .......... | 365/226 |
| 5,610,871 A | * | 3/1997 | Hidaka .................... | 365/230.03 |
| 5,671,173 A | | 9/1997 | Tomita | |
| 6,016,390 A | * | 1/2000 | Mali et al. ..................... | 716/17 |
| 6,646,312 B1 | | 11/2003 | Kikuchi | |
| 2002/0064075 A1 | | 5/2002 | Morishima | |
| 2002/0105826 A1 | | 8/2002 | Yamauchi | |
| 2002/0182844 A1 | | 12/2002 | Igarashi | |

FOREIGN PATENT DOCUMENTS

| | | | |
|---|---|---|---|
| JP | 363133394 A | * | 6/1988 |
| JP | 363187494 A | * | 8/1988 |
| JP | 405198178 A | * | 8/1993 |

* cited by examiner

*Primary Examiner*—Viet Q. Nguyen
(74) *Attorney, Agent, or Firm*—Farjami & Farjami LLP

(57) ABSTRACT

According to one exemplary embodiment, a semiconductor die includes a memory core array situated over a substrate, where the memory core array includes a number of bitlines, where the bitlines can be situated in a first interconnect metal layer in the semiconductor die. The semiconductor die further includes an interconnect structure situated over the memory core array, where the interconnect structure is situated in a second interconnect metal layer in the semiconductor die and situated over each of the bitlines. The interconnect structure can include at least one interconnect line, which can form an angle with respect to the bitlines that can be greater than 0.0 degrees and less than or equal to 90.0 degrees. The interconnect structure can form one of a number of capacitances with each of the bitlines, where each of the capacitances can be substantially equal in value to each other of the capacitances.

7 Claims, 3 Drawing Sheets

POWER INTERCONNECT STRUCTURE FOR BALANCED BITLINE CAPACITANCE IN A MEMORY ARRAY

TECHNICAL FIELD

The present invention is generally in the field of semiconductor devices. More particularly, the present invention is in the field of memory arrays.

BACKGROUND ART

Many semiconductor devices, such as microprocessors or "memory semiconductor dies" used as an example herein, include a core memory array, which comprise bitlines that run in a direction perpendicular to wordlines. The memory semiconductor die also includes sense amplifiers, which are typically situated near the center of the semiconductor die, and VCC and VSS pads, which may be situated at the top or bottom of the semiconductor die. The VCC and VSS pads can be coupled to the sense amplifiers by power interconnect lines, which are typically formed over the core memory array in an interconnect metal layer in the semiconductor die.

In a conventional memory semiconductor die, the power interconnect lines generally run straight lines over the bitlines. However, the bitlines are substantially narrower than the power interconnect lines and the spacing between adjacent bitlines is substantially less than the spacing between adjacent power interconnect lines. As a result, some of the bitlines may be situated under power interconnect lines, while other bitlines may not be situated under power interconnect lines. As a consequence, the coupling capacitance between a bitline situated under a power interconnect line and the power interconnect line will be greater than the coupling capacitance for a bitline that is not situated under the power interconnect line.

Thus, an unbalanced coupling capacitance between bitlines in a memory core array and power interconnect lines situated above the memory core array can exist in a conventional memory semiconductor die. However, for effective bitline sensing, it is advantageous to have a balanced coupling capacitance between bitlines and power interconnect lines.

Thus, there is a need in the art for balanced coupling capacitance between bitlines in a memory core array and power interconnect lines situated over the memory core array.

SUMMARY

The present invention is directed to a power interconnect structure for balanced bitline capacitance in a memory array. The present invention addresses and resolves the need in the art for balanced coupling capacitance between bitlines in a memory core array and power interconnect lines situated over the memory core array in a memory semiconductor die.

According to one exemplary embodiment, a semiconductor die includes a memory core array situated over a substrate, where the memory core array includes a number of bitlines, where the bitlines can be situated in a first interconnect metal layer in the semiconductor die. The semiconductor die further includes an interconnect structure situated over the memory core array, where the interconnect structure is situated in a second interconnect metal layer in the semiconductor die. The interconnect structure is situated over each of the bitlines. The interconnect structure can include at least one interconnect line. The at least one interconnect line can form an angle with respect to the bitlines, where the angle can be greater than 0.0 degrees and less than or equal to 90.0 degrees.

According to this exemplary embodiment, the interconnect structure can form one of a number of capacitances with each of the bitlines, where each of the capacitances can be substantially equal in value to each other of the capacitances. The interconnect structure can be a power interconnect structure and can have a voltage such as VCC or VSS, for example. Other features and advantages of the present invention will become more readily apparent to those of ordinary skill in the art after reviewing the following detailed description and accompanying drawings.

DETAILED DESCRIPTION OF THE INVENTION

Figure 1:
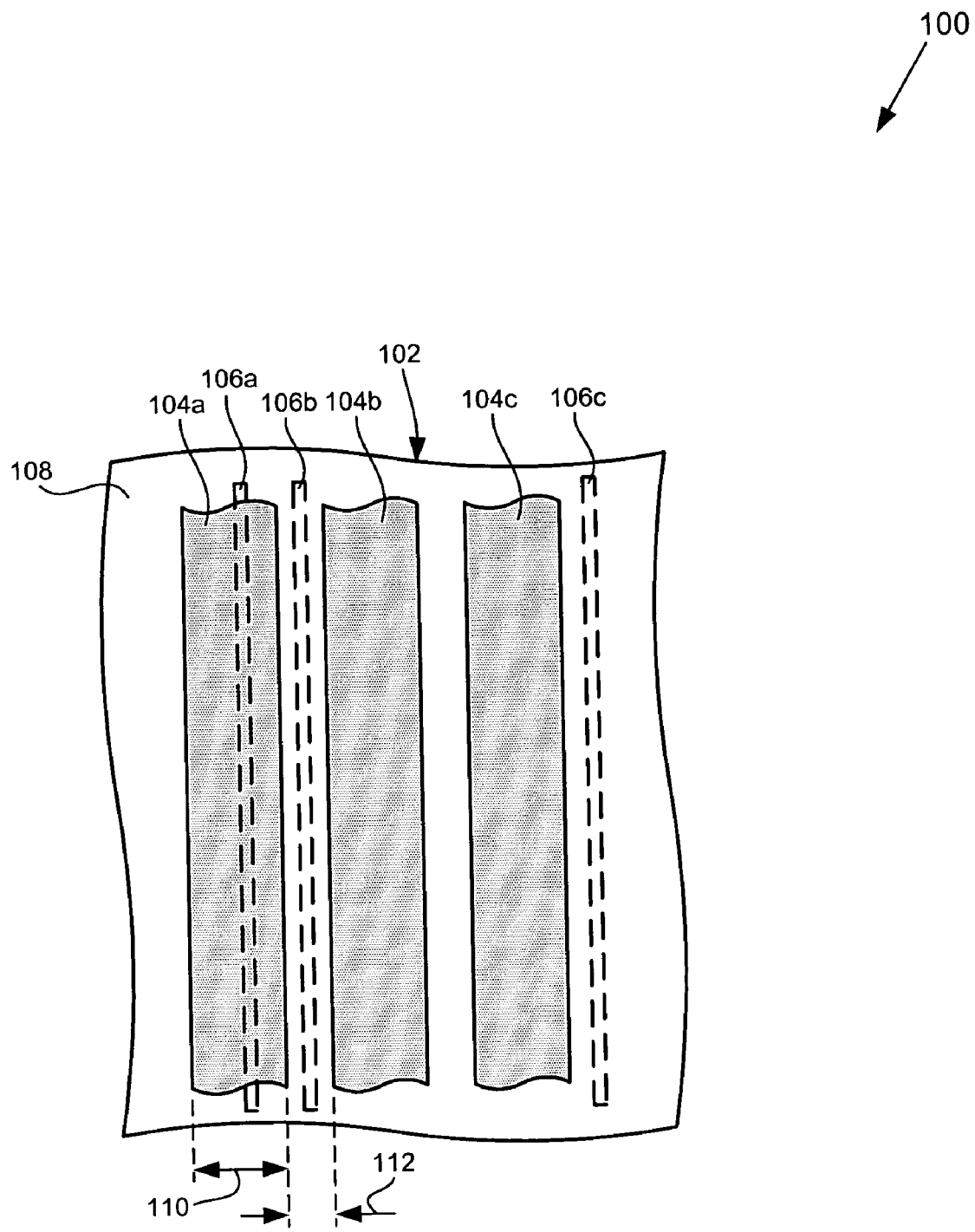
FIG. 1 illustrates a top view of conventional exemplary structure including exemplary power interconnect lines situated over an exemplary memory core array.

The present invention is directed to a power interconnect structure for balanced bitline capacitance in a memory array. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

In the present application, a memory semiconductor die is utilized to illustrate the present invention, which provides a balanced coupling capacitance between bitlines in a memory core array and a power interconnect structure situated above the memory core array. However, the present invention can also be applied to achieve a balanced coupling capacitance between interconnect lines in different interconnect metal layers in semiconductor dies other than memory semiconductor dies.

FIG. 1 shows a top view of a conventional exemplary structure including exemplary interconnect lines situated over an exemplary memory core array. Structure 100, which can be a portion of a semiconductor die, such as a memory semiconductor die, includes memory core array 102, interlayer dielectric ("ILD") layer 108, and interconnect lines, 104a, 104b, and 104c. Memory core array 102, which is situated on a substrate (not shown in FIG. 1), includes bitlines 106a, 106b, and 106c. Memory core array 102 can be a flash memory core array, a read-only memory (ROM) core array, or other type of memory core array.

As shown in FIG. 1, bitlines 106a, 106b, and 106c are situated in an interconnect metal layer of a semiconductor die and over a substrate (not shown in FIG. 1) and can comprise a metal such as aluminum or copper, for example. Bitlines 106a, 106b, and 106c are situated parallel to each other and can each have a width of approximately 0.25 micron, for example. Bitlines 106a, 106b, and 106c can have a pitch of less than 1.0 micron, for example. Also shown in FIG. 1, ILD layer 108 is situated over bitlines 106a, 106b, and 106c and can comprise an appropriate dielectric material. Further shown in FIG. 1, conventional interconnect lines 104a, 104b, and 104c are situated over ILD layer 108 and can be power interconnect lines. Interconnect lines can have a voltage such as VCC (e.g. a supply voltage) or VSS (e.g. a ground voltage), for example. Interconnect lines 104a, 104b, and 104c each have width 110, which may be, for example, between 15.0 and 20.0 microns. Spacing 112 between adjacent interconnect lines, such as between interconnect lines 104a and 104b, can be, for example, approximately 5.0 microns.

Bitlines 106a, 106b, and 106c have a pitch that is substantially less than spacing 112 between interconnect lines 104a, 104b, and 104c. Also, interconnect lines 104a, 104b, and 104c are situated in a direction parallel to bitlines 106a, 106b, and 106c. As a result, some bitlines, such as bitline 106a, may be situated under an interconnect line, such as interconnect line 104a, while other bitlines, such as bitline 106b, may not be situated under an interconnect line. Consequently, in conventional structure 100, the coupling capacitance between a bitline situated under a interconnect line and the interconnect line is greater than the coupling capacitance between a bitline that is not situated under the interconnect line and the interconnect line. As a result, the coupling capacitance between bitlines 106a, 106b, and 106c and interconnect lines 104a, 104b, and 104c is not balanced, which can detrimentally affect data sensing on bitlines 106a, 106b, and 106c.

Figure 2:
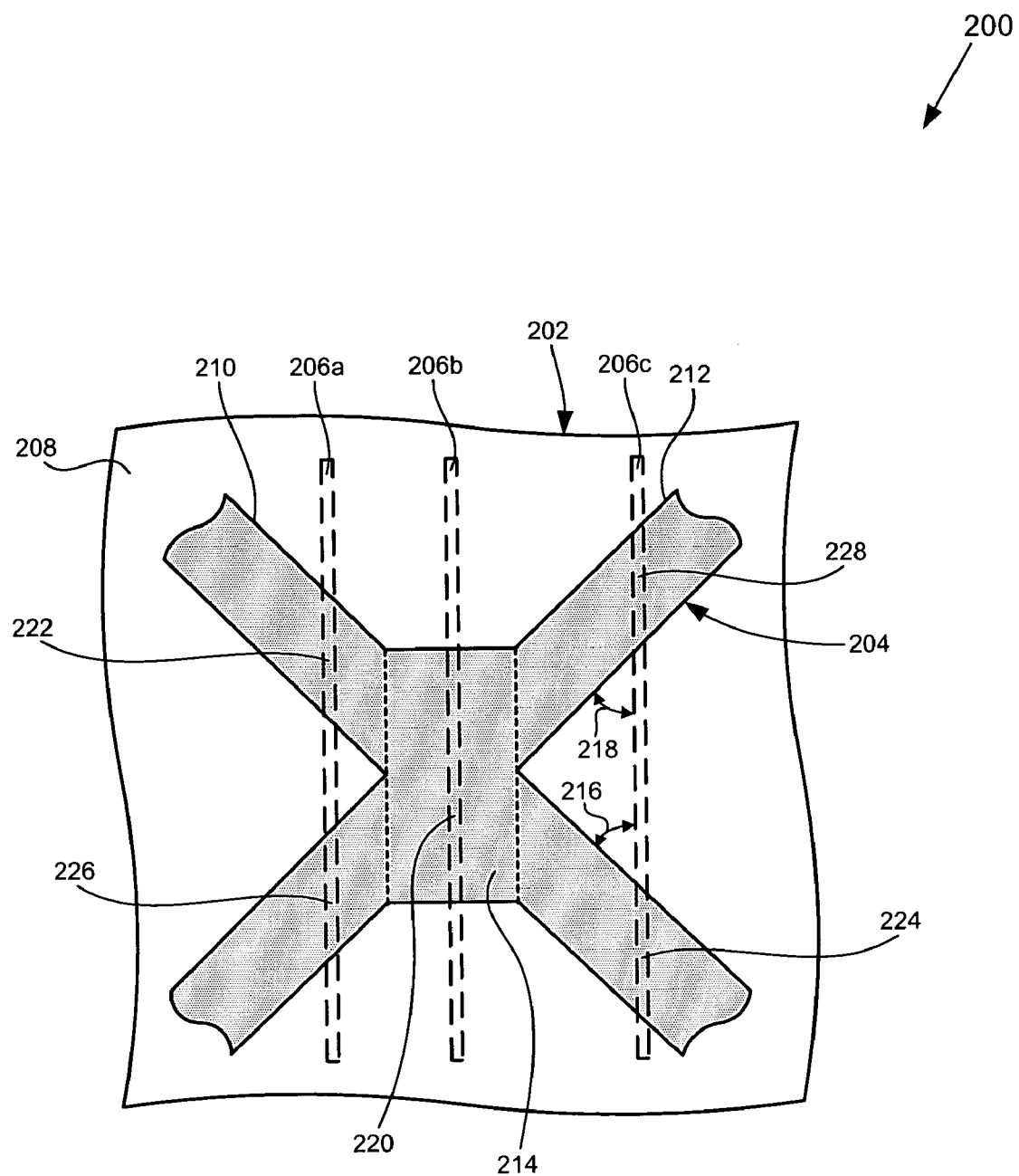
FIG. 2 illustrates a top view of an exemplary structure including an exemplary power interconnect structure situated over an exemplary memory core array, in accordance with one embodiment of the present invention.

FIG. 2 shows a top view of an exemplary structure including an exemplary interconnect structure situated over an exemplary memory core array in accordance with one embodiment of the present invention. Structure 200, which can be a semiconductor die, such as a memory semiconductor die, includes memory core array 202, interconnect structure 204, and ILD layer 208. Memory core array 202 includes bitlines 206a, 206b, and 206c and interconnect structure 204 includes interconnect lines 210 and 212 and interconnect center portion 214. Memory core array 202 can be a flash memory core array, a ROM core array, or other type of memory core array. It is noted that although only interconnect lines 210 and 212 and interconnect center portion 214 are described in detail herein to preserve brevity, interconnect structure 204 can include more than two interconnect lines and more than one interconnect center portion.

As shown in FIG. 2, bitlines 206a, 206b, and 206c are situated in an interconnect metal layer of a semiconductor die and situated over a substrate (not shown in FIG. 2). Bitlines 206a, 206b, and 206c are situated parallel to each other and can comprise a metal such as aluminum, copper, or other appropriate metal or metal stack. In the present embodiment, bitlines 206a, 206b, and 206c can be situated in a third interconnect metal layer ("M3") in the semiconductor die. In other embodiments, bitlines 206a, 206b, and 206c may be situated in a second interconnect metal layer ("M2") in the semiconductor die or in an interconnect metal layer that is higher than M3. Bitlines 206a, 206b, and 206c can be substantially similar in width and pitch as bitlines 106a, 106b, and 106c in memory core array 102 in FIG. 1. It is noted that although only bitlines 206a, 206b, and 206c are described in detail herein to preserve brevity, memory core array 202 can include a number of additional bitlines, including additional bitlines situated between bitlines 206a and 206b and between bitlines 206b and 206c.

Also shown in FIG. 2, ILD layer 208 is situated over bitlines 206a, 206b, and 206c and can comprise a dielectric material having a low dielectric constant (i.e. a low-k dielectric material), a high-k dielectric material, or other appropriate type of dielectric material. Further shown in FIG. 2, interconnect structure 204 is situated over ILD layer 208 and can comprise aluminum, copper, or other appropriate type of metal or metal stack. In the present embodiment, interconnect structure 204 can be situated in a fourth interconnect metal layer ("M4") in the semiconductor die. In other embodiments, interconnect structure 204 may be situated in an interconnect metal layer that is lower or higher than M4. Interconnect structure 204 can be a power interconnect structure and can have a voltage such as VCC, VSS, or other appropriate voltage. Interconnect structure 204 can be utilized, for example, to route power between VCC and VSS pads (not shown in FIG. 2) and sense amplifiers (not shown in FIG. 2).

Also shown in FIG. 2, interconnect structure 204 includes interconnect lines 210 and 212, which intersect each other, and interconnect center portion 214, which is situated at the intersection of interconnect lines 210 and 212. Interconnect lines 210 and 212 can have a width of between approximately 15.0 microns and approximately 20.0 microns, for example. However, interconnect lines 210 may also have a width that is less than 15.0 microns or greater than 20.0 microns. Interconnect line 210 forms angle 216 with respect to bitlines 206a, b, and c, and interconnect line 212 forms angle 218 with respect to bitlines 206a, b, and c. In the present embodiment, angles 216 and 218 can be approximately equal to 45.0 degrees. In other embodiments, angle 216 may be between 0.0 and 90.0 degrees and angle 218 may be between 0.0 and 90.0 degrees. In other embodiments, angle 216 may be larger or smaller than angle 218.

Interconnect center portion 214 of interconnect structure 204 is situated over segment 220 of bitline 206b and can have a rectangular shape. In another embodiment, interconnect center portion 214 may a shape other than a rectangle. Interconnect line 210 is situated over respective segments 222 and 224 of bitlines 206a and 206c and interconnect line 212 is situated over respective segments 226 and 228 of bitlines 206a and 206c. The area of segment 220 of bitline 206b is substantially equal to the sum of the respective areas of segments 222 and 224 of bitlines 206a and 206c and also substantially equal to the sum of the respective areas of segments 226 and 228 of bitlines 206a and 206c.

Thus, interconnect structure 204 is situated over substantially the same area of each of bitlines 206a, 206b, and 206c. As a result, respective coupling capacitances between interconnect structure 204 and bitlines 206a, 206b, and 206c are substantially equal in value. Thus, in the embodiment in FIG. 2, by providing an interconnect structure that is over a substantially equal area of each bitline situated in a memory core array, the present invention advantageously achieves a coupling capacitance having a substantially equal value between each bitline and the interconnect structure. Thus, in the embodiment in FIG. 2, the present invention advantageously achieves a balanced coupling capacitance between bitlines in a memory core array and a power interconnect structure situated above the memory core array.

Figure 3:
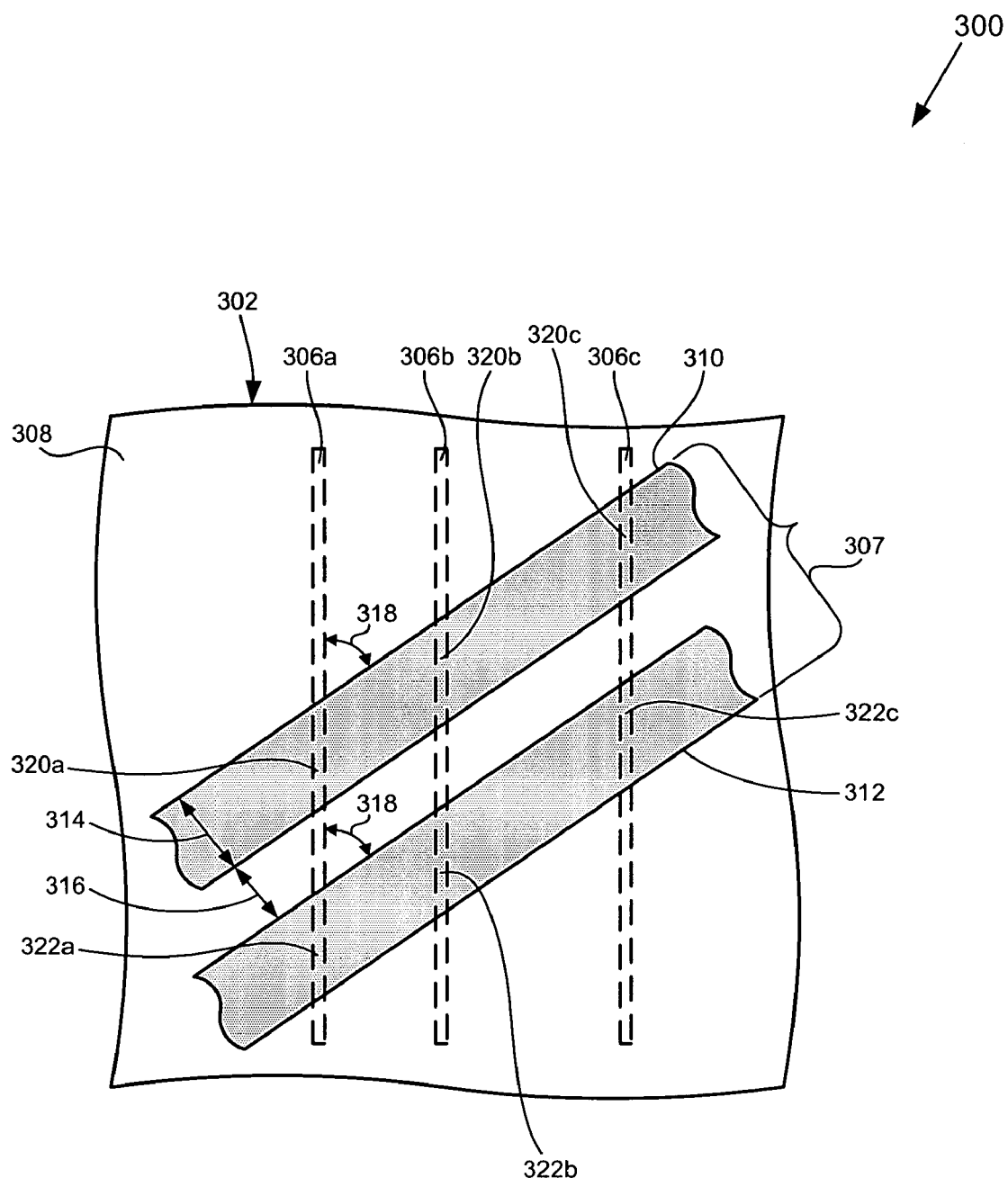
FIG. 3 illustrates a top view of an exemplary structure including an exemplary power interconnect structure situated over an exemplary memory core array, in accordance with another embodiment of the present invention.

FIG. 3 shows a top view of an exemplary structure including exemplary interconnect lines situated over an exemplary memory core array in accordance with one embodiment of the present invention. In FIG. 3, memory core array 302, bitlines 306a, 306b, and 306c, and ILD layer 308 in structure 300 correspond, respectively, to memory core array 202, bitlines 206a, 206b, and 206c, and ILD layer 208 in structure 200 in FIG. 2. Structure 300, which can comprise a portion of a semiconductor die, such as a memory semiconductor die, includes memory core array 302, interconnect structure 307, and ILD layer 308. Interconnect structure 307 includes interconnect lines 310 and 312 and memory core array 302 includes bitlines 306a, 306b, and 306c. It is noted that although interconnect lines 310 and 312 are described in detail herein to preserve brevity, interconnect structure 307 can include more than two interconnect lines that are situated parallel to each other.

As shown in FIG. 3, bitlines 306a, 306b, and 306c are situated in an interconnect metal layer of a semiconductor die and situated over a substrate (not shown in FIG. 3) and ILD layer 308 is situated over bitlines 306a, 306b, and 306c. Also shown in FIG. 3, interconnect lines 310 and 312 are situated over ILD layer 308 and situated over bitlines 306a, 306b, and 306c and can comprise aluminum, copper, or other appropriate type of metal or metal stack. In the present embodiment, interconnect lines 310 and 312 can be situated in M4 in the semiconductor die. In other embodiments, interconnect lines 310 and 312 may be situated in an interconnect metal layer that is lower or higher than M4. Interconnect lines 310 and 312 can be power interconnect lines and can have voltage such as VCC, VSS, or a voltage other than VCC or VSS. Interconnect lines 310 and 312 can be utilized, for example, to route power between VCC and VSS pads (not shown in FIG. 3) and sense amplifiers (not shown in FIG. 3).

Interconnect lines 310 and 312 have width 314, which can be, for example, between approximately 15.0 and approximately 20.0 microns. However, width 314 may be greater than 20.0 microns or less than 15.0 microns. Spacing 316 between interconnect lines 310 and 312, which are situated parallel to each other, can be, for example, approximately 5.0 microns. However, spacing 316 may be greater or less than 5.0 microns. Interconnect lines 310 and 312 form angle 318 with respect to bitlines 306a, 306b, and 306c. By way of example, angel 318 can be greater than 0.0 degrees and less than or equal to 90.0 degrees. Interconnect line 310 is situated over respective segments 320a, 320b, and 320c of bitlines 306a, 306b, and 306c and interconnect line 312 is situated over respective segments 322a, 322b, and 322c of bitlines 306a, 306b, and 306c.

Respective segments 320a, 320b, and 320c of bitlines 306a, 306b, and 306c have substantially equal areas and respective segments 322a, 322b, and 322c of bitlines 306a, 306b, and 306c have substantially equal areas. Thus, interconnect line 310 is situated over substantially equal areas of bitlines 306a, 306b, and 306c and interconnect line 312 is situated over substantially equal areas of bitlines 306a, 306b, and 306c. As a result, respective coupling capacitances between interconnect line 310 and bitlines 306a, 306b, and 306c are substantially equal in value and respective coupling capacitances between interconnect line 312 and bitlines 306a, 306b, and 306c are substantially equal in value.

Thus, in the embodiment in FIG. 3, by providing an interconnect structure having interconnect lines that are situated over substantially equal areas of each bitline in a memory core area, the present invention achieves a substantially equal coupling capacitance between each bitline and each interconnect metal line. Thus, in the embodiment in FIG. 3, the present invention advantageously achieves a balanced coupling capacitance between the bitlines in a memory core array and an interconnect structure including interconnect lines situated above the memory core array.

Thus, as discussed above, in the respective embodiments of FIGS. 2 and 3, by forming an interconnect structure, such as a power interconnect structure, that is situated over each bitline in a memory core array, the present invention advantageously achieves a balanced coupling capacitance between the bitlines and the interconnect structure. In contrast, in the conventional structure in FIG. 1, some interconnect lines are situated over bitlines in a memory core array while other interconnect lines are not situated over bitlines in the memory core. As a result, in the conventional structure in FIG. 1, coupling capacitance between bitlines and interconnect lines is not balanced, which can detrimentally affect data sensing on the bitlines. Thus, by balancing capacitance coupling between each bitline and a power interconnect structure situated over the bitlines, the present invention advantageously achieve more effective bitline data sensing compared to a conventional structure having an unbalanced bitline/interconnect line coupling capacitance.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a power interconnect structure for balanced bitline capacitance in a memory array has been described.

The invention claimed is:

1. A semiconductor die comprising:
   a memory core array situated over a substrate, said memory core array comprising a plurality of bitlines, said plurality of bitlines being situated in a first interconnect metal layer in said semiconductor die;
   an interconnect structure situated over said memory core array, said interconnect structure being situated in a second interconnect metal layer in said semiconductor die;
   wherein said interconnect structure is situated over each of said plurality of bitlines, wherein said interconnect structure forms one of a plurality of capacitances with each of said plurality of bitlines, wherein each of said plurality of capacitances is substantially equal in value to each other of said plurality of capacitances, and wherein said at least one interconnect line forms an angle with respect to said plurality of bitlines, wherein said angle is greater than 0.0 degrees and less than or equal to 90.0 degrees.

2. A semiconductor die comprising:
   a memory core array situated over a substrate, said memory core array comprising a plurality of bitlines, said plurality of bitlines being situated in a first interconnect metal layer in said semiconductor die;

an interconnect structure situated over said memory core array, said interconnect structure being situated in a second interconnect metal layer in said semiconductor die;

wherein said interconnect structure is situated over each of said plurality of bitlines, wherein said interconnect structure comprises at least one interconnect line, wherein said at least one interconnect line comprises a plurality of parallel interconnect lines, and wherein said each of said plurality of interconnect lines forms an angle with respect to said plurality of bitlines, wherein said angle is greater than 0.0 degrees and less than or equal to 90.0 degrees.

3. A semiconductor die comprising:

a memory core array situated over a substrate, said memory core array comprising a plurality of bitlines;

an interconnect structure situated over said memory core array, said interconnect structure being situated over each of said plurality of bitlines;

wherein said interconnect structure forms one of a plurality of capacitances with each of said plurality of bitlines, wherein each of said plurality of capacitances is substantially equal in value to each other of said plurality of capacitances, wherein said interconnect structure comprises first and second interconnect lines and an interconnect center portion, wherein said interconnect center portion is situated at an intersection of said first interconnect line and said second interconnect line.

4. The semiconductor die of claim 3 wherein said interconnect center portion is situated over a first area of one of said plurality of bitlines, said first interconnect line is situated over a second area of a second one of said plurality of bitlines, and said second interconnect line is situated over a third area of said second one of said plurality of bitlines.

5. The semiconductor die of claim 4 wherein said first area is substantially equal to a sum of said second area and said third area.

6. The semiconductor die of claim 3 wherein said first interconnect line forms an angle with respect to said plurality of bitlines, wherein said angle is between 0.0 degrees and 90.0 degrees.

7. The semiconductor die of claim 6 wherein said angle is approximately equal to 45.0 degrees.

* * * * *